(12) United States Patent
Stanisavljevic et al.

(10) Patent No.: US 11,146,293 B2
(45) Date of Patent: Oct. 12, 2021

(54) SYSTEM AND METHOD FOR OPTIMIZING REED-SOLOMON DECODER FOR ERRORS AND ERASURES

(71) Applicant: International Business Machines Corporation, Armonk, NY (US)

(72) Inventors: Milos Stanisavljevic, Adliswil (CH); Thomas Mittelholzer, Zurich (CH); Nikolaos Papandreou, Thalwil (CH); Charalampos Pozidis, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 16/813,921

(22) Filed: Mar. 10, 2020

(65) Prior Publication Data

US 2021/0288669 A1 Sep. 16, 2021

(51) Int. Cl.
*H03M 13/00* (2006.01)
*H03M 13/15* (2006.01)

(52) U.S. Cl.
CPC ..... *H03M 13/1515* (2013.01); *H03M 13/154* (2013.01); *H03M 13/1545* (2013.01); *H03M 13/1575* (2013.01)

(58) Field of Classification Search
CPC ........... H03M 13/1515; H03M 13/154; H03M 13/1545; H03M 13/1575
See application file for complete search history.

(56) References Cited

U.S. PATENT DOCUMENTS

| | | | | |
|---|---|---|---|---|
| 5,323,402 A | * | 6/1994 | Vaccaro | H03M 13/151 714/751 |
| 5,610,929 A | * | 3/1997 | Yamamoto | G11B 20/1866 714/758 |
| 6,119,262 A | * | 9/2000 | Chang | H03M 13/158 341/94 |
| 6,574,771 B1 | | 6/2003 | Kwon | |

(Continued)

OTHER PUBLICATIONS

Atieno, L., et al., "An Adaptive Reed-Solomon Errors-and-Erasures Decoder", FPGA '06, Feb. 22-24, 2006, 9 pages.
Sankaran, J., "Reed-Solomon Decoder: TMS320C64x Implementation", Texas Instruments, Application Report SPRA686, Dec. 2000, 70 pages.

(Continued)

*Primary Examiner* — Esaw T Abraham
(74) *Attorney, Agent, or Firm* — Scully, Scott, Murphy & Presser, P.C.

(57) ABSTRACT

A memory system, Reed Solomon ("RS") Decoder, and method for decoding Reed-Solomon codewords includes: a Syndrome Computation engine configured as a first stage of a pipeline for receiving the RS codeword and computing one or more Syndromes; an initialization unit for providing initialization values for a key equation solver engine that generates the errata locator polynomial and the errata magnitude polynomial configured as a second stage; and as a third stage a Chien Search engine for receiving the error locator polynomial and determining the one or more locations of the one or more erasures and random errors in the received RS codeword and an error-value evaluation ("EE") engine for receiving the errata magnitude polynomial and determining the one or more magnitudes of the one or more erasures and random errors in the RS received codeword.

20 Claims, 7 Drawing Sheets

(56) References Cited

U.S. PATENT DOCUMENTS

| | | | | |
|---|---|---|---|---|
| 6,615,585 | B2* | 9/2003 | Tsuji | F01K 23/06 60/39.53 |
| 7,096,409 | B2* | 8/2006 | Banks | H03M 13/1515 714/784 |
| 7,693,927 | B2* | 4/2010 | Lawrow | G06F 7/724 708/492 |
| 7,870,468 | B1* | 1/2011 | Vanka | H03M 13/1525 714/784 |
| 7,987,412 | B2 | 7/2011 | Lakshminarayana et al. | |
| 8,335,808 | B2* | 12/2012 | Shieh | H03M 13/1525 708/200 |
| 8,365,054 | B2* | 1/2013 | Gasanov | H03M 13/154 714/784 |
| 8,397,143 | B2* | 3/2013 | Neznanov | H03M 13/151 714/785 |
| 9,971,713 | B2 | 5/2018 | Asaad et al. | |
| 2003/0131308 | A1* | 7/2003 | Lee | H03M 13/158 714/781 |

OTHER PUBLICATIONS

Biard, L., et al., "Reed-Solomon Codes for Low Power Communications", Journal of Communications, Apr. 2008, pp. 13-21, vol. 3, No. 2.

Anonymous, "Method and System for Optimizing Network Resources by Verifying Data Integrity based on Operations Performed on Data Slices", An IP.com Prior Art Database Technical Disclosure, IP.com No. IPCOM000253872DIP.com, May 11, 2018, 3 pages.

Anonymous, Method for I/O Performance Improvement in Erasure Code Environment, An IP.com Prior Art Database Technical Disclosure, IP.com No. IPCOM000228152D, Jun. 10, 2013, 8 pages.

Zhong, C., et al., "LDPC Codes for Robust Transmission of Images Over Wireless Channels", Conference Record of the Thirty-Fifth Asilomar Conference on Signals, Systems and Computers, Feb. 2001, pp. 797-800, vol. 1.

Zhang, T., et al., "On the High-Speed VLSI Implementation of Errors-and-Erasures Correcting Reed-Solomon Decoders", GLSVLSI '02, Apr. 18-19, 2002, pp. 89-93.

* cited by examiner

SYSTEM AND METHOD FOR OPTIMIZING REED-SOLOMON DECODER FOR ERRORS AND ERASURES

BACKGROUND

The present invention relates generally to error detection and correction in information handling systems, for example computer systems (memory storage), including error correction correcting codes, for example, general type of Bose-Chaudhuri-Hocquenghem (BCH) codes and more specifically Reed-Solomon codes, including an improved Reed-Solomon decoder configuration and method of decoding Reed-Solomon codewords.

Memory is one of the more important components used in information handling systems, computer systems, storage solutions, and mobile devices. Performance, scalability, reliability, and cost of memory devices are major criteria in determining use of such devices. Typically, nearly all information handling systems, computer systems, storage solutions, mobile devices, and other computing based products use one or a combination of charge based volatile memories, such as for example, DRAM, and/or non-volatile memories, such as for example NAND flash. Storage Class Memory (SCM) is a non-volatile memory (NVM) that has application in information handling systems, computing systems, storage solutions (memory systems), and mobile devices.

Storage class memory (SCM) is a type of persistent memory that combines the low latency and byte-addressability of dynamic read access memory (DRAM) with the non-volatility, area density, and economical characteristics of traditional storage media. Examples of SCM technology include 3D XPoint, ReRam, and Spin Transfer Torque—Magnetic Random Access Memory (STT-MRAM). To achieve high capacity and fast access flash and SCM technology based devices contain multiple chips/packages, which are accessed in parallel by the memory controller. One characteristic of SCMs is that these memory devices have finite write endurance. A memory device with finite write endurance means that it cannot be written indefinitely before parts of the SCM start faulting. Error Correction Code (ECC) and Redundant Array of Independent Disks (RAID) schemes are used to achieve high reliability and robustness against chip/package failures.

One ECC technique for improving the robustness of memory technology, e.g., SCM technology, is to use Reed-Solomon codes, including a Reed Solomon encoder and decoder to detect and correct errors. Implementing a Reed-Solomon decoder extracts a penalty in terms of processing time. Realizing high throughput of a Reed-Solomon decoder is usually achieved through multiple instances of the same decoder. While using multiple Reed-Solomon decoders can increase throughput it does not reduce latency and has a high overhead (area penalty). Achieving high throughput and reducing the latency associated with using a Reed-Solomon decoder would be advantageous.

SUMMARY

The summary of the disclosure is given to aid understanding of a computer system, computer architectural structure, processors, memory systems, Error Correction Code (ECC) including Reed-Solomon systems, and methods of media management, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the computer system, the architectural structure, processor, memory storage, the ECC schemes, and their method of operation to achieve different effects.

A Reed-Solomon decoder for decoding Reed-Solomon codewords is disclosed where in one or more embodiments the Reed-Solomon decoder includes: one or more Syndrome Computation engines for receiving the Reed-Solomon ("RS") codeword and computing one or more Syndromes; a key equation solver engine for generating the errata locator polynomial and the errata magnitude polynomial; one or more initialization units for providing initialization values for the key equation solver engine; one or more Chien Search engines for receiving the error locator polynomial and determining the one or more locations of the one or more erasures and random errors in the received Reed-Solomon codeword; and one or more error-value evaluation ("EE") engines for receiving the errata magnitude polynomial and determining the one or more magnitudes of the one or more erasures and random errors in the RS received codeword, wherein the Reed-Solomon decoder is configured as a three stage pipeline wherein the one or more Syndrome Computation engines are configured in a first stage, the key equation solver engine and the one or more initialization units are configured as a second stage, and the one or more Chien Search engines and the one or more EE engines are configured as a third stage.

The one or more initialization units in an aspect are parallelized to calculate the initialization values in a single clock cycle. The one or more Syndrome Computation engines in one or more embodiments are parallelized so that the parallelized group of the one or more Syndrome Computation engines computes the one or more Syndromes for the received RS codeword in 2t+1 clock cycles, where t is the number of random errors that can be corrected in the received RS codeword. In an aspect, the one or more Chien Search engines are parallelized so that the parallelized group of the one or more Chien Search engines solves the errata locator polynomial in 2t+1 clock cycles. The one or more Chien Search engines and the one or more EE engines in an aspect are combined in one or more CS/EE units where each combined CS/EE unit shares resources, and the one or more combined SC/EE units are parallelized to solve the errata locator polynomial and the errata magnitude polynomial in 2t+1 clock cycles.

One or more embodiments of a memory system is also disclosed that includes a memory module comprising a plurality of memory devices, a Reed-Solomon encoder and a Reed Solomon decoder, the Reed Solomon decoder configured as a three stage pipeline having one or more Syndrome Computation engines arranged and configured in a first stage of the RS decoder pipeline for receiving the Reed-Solomon codeword and computing the Syndromes; a key equation solver (KES) engine for generating the errata locator polynomial and the errata magnitude polynomial; one or more initialization (INIT) units for providing initialization values for the KES engine; wherein the KES engine and one or more INIT units are configured in a second stage of the RS decoder pipeline; one or more Chien Search (CS) engines for receiving the errata locator polynomial and determining the location of one or more erasures and random errors in the received RS codeword; and one or more error-value evaluation ("EE") engines for calculating the magnitude of the erasures and random errors in the received RS codeword, the one or more CS engines and the one or more EE engines are combined in one or more combined CS/EE units where each combined CS/EE unit shares resources, wherein the one or more combined CS/EE units are configured in a third stage of the RS decoder pipeline.

A method is also disclosed for decoding Reed-Solomon codes for errata including at least one of the group consisting of random errors, erasures, and combinations thereof, the method comprising: receiving a RS codeword in a first stage of an RS decoder; in response to receiving the RS codeword, computing one or more Syndromes in the first stage of the RS decoder; receiving the one or more Syndromes in a second stage of the RS decoder; in response to receiving the one or more Syndromes, computing the errata locator polynomial and the errata magnitude polynomial in the second stage of the RS decoder; receiving the errata locator polynomial and the errata magnitude polynomial in a third stage of the RS decoder: and in response to receiving the errata locator polynomial and the errata magnitude polynomial, computing the errata locations and errata magnitudes. In one or more embodiments, the first stage comprises one or more Syndrome Computation (SC) engines to compute the Syndromes, the third stage comprises one or more Chien Search (CS) engines to solve the errata locator polynomial and one or more Error Evaluator (EE) engines to solve the errata magnitude polynomial and the one or more CS engines and EE engines are combined into one or more CS/EE blocks; and wherein, the one or more SC engines are parallelized to complete in $CC_{SC}$ clock cycles where $CC_{SC}$ is the nearest whole integer that is equal to or not less than 2t+1; and the one or more CS/EE blocks are parallelized to complete in $CC_{CS/EE}$ clock cycles, where $CC_{SC}$ is the nearest whole integer that is equal to or not less than 2t+1.

The foregoing and other objects, features and advantages of the invention will be apparent from the following more particular descriptions of exemplary embodiments of the invention as illustrated in the accompanying drawings wherein like reference numbers generally represent like parts of illustrative embodiments of the invention.

BRIEF DESCRIPTION OF THE DRAWINGS

The various aspects, features and embodiments of a computer system, computer architectural structure, processors, memory systems, Error Correction Code (ECC) including Reed-Solomon codes, and their method of operation will be better understood when read in conjunction with the figures provided. Embodiments are provided in the figures for the purpose of illustrating aspects, features, and/or various embodiments of the computer system, computer architectural structure, processors, memory systems (e.g., SCM), Error Correction Code (ECC) including Reed-Solomon codes and systems including Reed-Solomon decoders, and their method of operation, but the claims should not be limited to the precise arrangement, structures, features, aspects, assemblies, subassemblies, systems, circuitry, embodiments, methods, processes, techniques, and/or devices shown, and the arrangements, structures, systems, assemblies, subassemblies, features, aspects, methods, processes, techniques, circuitry, embodiments, and devices shown may be used singularly or in combination with other arrangements, structures, assemblies, subassemblies, systems, features, aspects, circuitry, embodiments, methods, techniques, processes, and/or devices.

DETAILED DESCRIPTION

Figure 1:
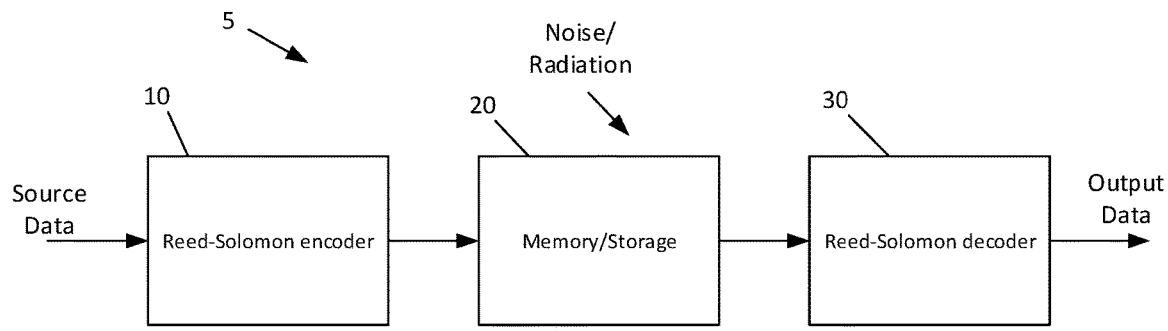
FIG. 1 illustrates a Reed-Solomon (RS) system utilizing a Reed-Solomon (RS) encoder and a Reed-Solomon (RS) decoder.

The following description is made for illustrating the general principles of the invention and is not meant to limit the inventive concepts claimed herein. In the following detailed description, numerous details are set forth in order to provide an understanding of the computer system, computer architectural structure, processors, memory systems, Error Correction Codes (ECC) including Reed-Solomon systems, and their method of operation, however, it will be understood by those skilled in the art that different and numerous embodiments of the computer system, computer architectural structure, processor, memory systems, Error Correction Codes (ECC) including Reed-Solomon systems, and their method of operation may be practiced without those specific details, and the claims and disclosure should not be limited to the arrangements, structures, systems, assemblies, subassemblies, circuitry, features, aspects, processes, methods, techniques, embodiments, and/or details specifically described and shown herein. Further, particular features, aspects, arrangements, systems, embodiments, techniques, etc. described herein can be used in combination with other described features, aspects, arrangements, systems, embodiments, techniques, etc. in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified, and that the terms "comprises" and/or "comprising," when used in this specification and claims, specify the presence of stated features, integers, aspects, arrangements, embodiments, structures, systems, assemblies, subassemblies, steps, operations, elements, and/or components, but do not preclude the presence or addition of one or more other features, integers, aspects, arrangements, embodiments, structures, systems, assemblies, subassemblies, steps, operations, elements, components, and/or groups thereof.

The following discussion omits or only briefly describes conventional features of information processing systems, including processors, microprocessor systems, memory systems, Reed-Solomon systems including Reed-Solomon encoders and decoders, and their architectures, and their method of operation, which should be apparent to those skilled in the art. It is assumed that those skilled in the art are familiar with the general architecture and operation of processors, memory systems, and error detection and correction techniques and systems including Reed-Solomon systems, (Reed Solomon encoders and decoders), and their operation. It may be noted that a numbered element is numbered according to the figure in which the element is introduced, and is typically referred to by that number throughout succeeding figures.

Reed-Solomon (RS) codes are block based error correcting codes (ECC) that have a wide range of applications in digital storage and communications. In an embodiment Reed-Solomon codes are used to correct errors in memory systems, e.g., data storage, including storage devices, for example, tape, DRAM, SCM, flash, compact disk, DVD, etc. Reed-Solomon codes have other applications beyond memory systems. Reed-Solomon (RS) codes are linear block codes. A typical Reed-Solomon (RS) system 5 employing Reed-Solomon (RS) codes is shown in FIG. 1 where source data is feed to a Reed-Solomon (RS) encoder 10 and the RS encoder 10 takes a block of source data, computes and adds extra parity bits. The encoded data is stored in memory 20. Errors can occur during transmission or storage of the data (Reed-Solomon (RS) codeword) for a number of reasons, including, for example, electro-magnetic radiation, static electricity, write and/or read noise, interference, faulty memory devices, etc. When the data from memory 20 is requested, the Reed-Solomon decoder 30 processes each block and attempts to detect and correct any errors that may have been introduced to the original data (Reed-Solomon (RS) codeword).

Figure 2:
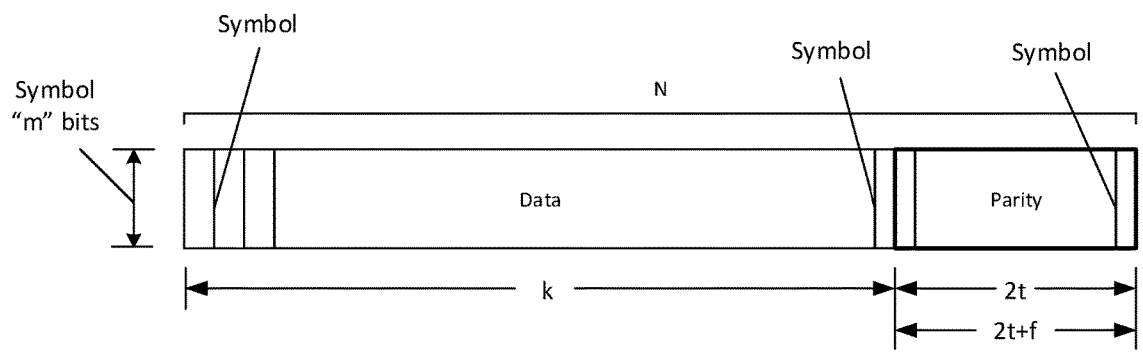
FIG. 2 illustrates an example of a Reed-Solomon codeword.

A Reed-Solomon (RS) code is specified as RS(N,k) with m-bit symbols. The RS encoder takes "k" data symbols of "m" bits each and adds parity symbols to make an "N" symbol codeword. There are (N−k) parity symbols of m-bits each. FIG. 2 shows a diagram of a Reed-Solomon codeword where "2t" parity symbols are appended to "k" data symbols. An example Reed-Solomon code is RS(255,223) with 8-bit symbols. Each RS codeword contains 255 word bytes (e.g., 255 eight (8) bit symbols), of which 223 bytes are data (k) and 32 bytes are parity. Error detection in a Reed-Solomon (RS) decoder is typically larger than the ability to correct an error, usually by a factor of 2:1, so two errors can be detected for every error that can be corrected. Typically the RS decoder can detect 2t symbol errors and can correct up to "t" symbols in a codeword that contain errors where 2t equals the number of parity symbols (i.e., N−k). In an example RS codeword, RS(255, 223) with 8-bit symbols, "N"=255, "k"=223, and "m"=8 since the symbols are 8-bits. The number of parity symbols is 32 (N−k) in the example RS(255,223), so "2t" is 32, and "t"=16. The RS decoder 30 can correct up to "t" symbols, so in the example using Reed-Solomon codeword RS(255,223), the decoder can correct any 16 symbol errors in the codeword. With RS(255, 223), where the symbol length is 8 bits, errors in up to 16 bytes anywhere in the codeword can be corrected.

For a given symbol size "m" (e.g., 8-bits), the maximum codeword length (N) for a Reed-Solomon code is $N=2^m-1$. For example, the maximum length of a codeword with 8-bit symbols ("m"=8) is 255 bytes. The amount of processing power to encode and decode Reed-Solomon codes is related to the number of parity symbols per codeword. A large number of parity symbols (bits) added to the data symbols means a large number of errors can be corrected, but requires more computational power than a small number of parity symbols (bits) added to the data symbols. One symbol error occurs when one or more bits in a symbol are wrong, or when all bits in a symbol are wrong. In the RS(255,233) example with 8 bit symbols, an RS decoder will be able to correct 16 symbol errors. On one hand, 16 bit errors can occur each in a separate symbol (8-bits or byte) so the decoder corrects 16 bit errors, or on the other hand, 16 complete byte errors occur so that the decoder corrects 16×8 bit errors. Since the RS codes can correct from one to all the bits in a symbol, RS codes are well suited to correct burst errors where a series of consecutive bits in the codeword has errors.

Reed-Solomon (RS) encoding and decoding can be carried out in software or in special-purpose hardware. Reed-Solomon (RS) decoding is the process that returns a corrected message from a potentially corrupted message and a RS codeword. RS Decoding is the process of repairing the message using the previously computed RS code. Reed-Solomon (RS) decoders can correct random errors or erasures. An erasure occurs when the position or location of an erred symbol is known. A random error occurs when neither the position nor magnitude of the error is known. A RS decoder can correct up to "t" errors or "2t" erasures. It is possible to correct one erased symbol for each error-correction (parity) symbol added to the code. If the error locations are not known, two parity symbols are needed to correct each random symbol error. Since the location of the error is known in an erasure (as opposed to a random error where the location of the error is unknown), calculating and correcting an erasure does not require as much processing and can be performed more easily and quicker. A RS decoder can be used and optimized to compute erasures. A different (RS) decoder can be used to process and optimize computing random errors. It is possible for a Reed-Solomon (RS) decoder to decode both erasures and (random) errors in the same RS codeword, up to a limit. Such a RS decoder is called an errors and erasures decoder, or an errata RS decoder.

There are many ways to decode RS codewords. A general outline of the RS decoding process for correcting random errors includes five (5) steps. First, the Syndrome S(x) of the message (e.g., the RS codeword, r(x)) is computed. Calculating the Syndrome S(x) allows a quick check to see if the input message r(x) is corrupted, since the Syndrome S(x) of the original codeword without any corruption is zero. If the codeword r(x) is corrupted, the syndromes S(x) contain all the information necessary to determine the correction that should be made. The Syndromes S(x) are computed from the decoder input, e.g., codeword/message r(x). There are as many independent syndromes S(x) as there are parity symbols, i.e., there are 2t syndromes, where t is the correction capabilities of the code.

Next, the error locator polynomial L(x) and the error evaluator polynomial m(x) are computed using the Syndromes S(x). The locator polynomial L(x) and error-evaluator polynomial m(x) are most commonly computed using Euclid's or the Berlekamp-Massey algorithm where the locator polynomial L(x) can be solved later on to determine the location of the errors, and the error-evaluator polynomial m(x) can be solved later on to determine the error magnitudes. The locator polynomial L(x) is a detector that identifies what symbols in the codeword are corrupted. The error evaluator polynomial m(x) evaluates how much the symbols were corrupted.

The location of the errors is determined from the locator polynomial L(x). The locator polynomial L(x) is solved to determine the location of the errors. A Chien Search (CS) algorithm can be used to compute the location of the errors by solving the locator polynomial L(x) for zero (by finding roots of the locator polynomial L(x)). The error magnitudes are determined from the error evaluator polynomial m(x).

The error evaluator polynomial m(x) is solved to determine the error magnitudes. The Forney Algorithm is an example algorithm to solve the error-evaluator polynomial m(x) and compute the error magnitudes. The error locations and error magnitudes in an aspect are used to arrive at the original codeword c(x). The encoded input message or codeword is repaired by subtracting (in Galois field arithmetic) the error polynomial e(x) from the input message r(x) to arrive at the original, uncorrupted message c(x).

Figure 3:
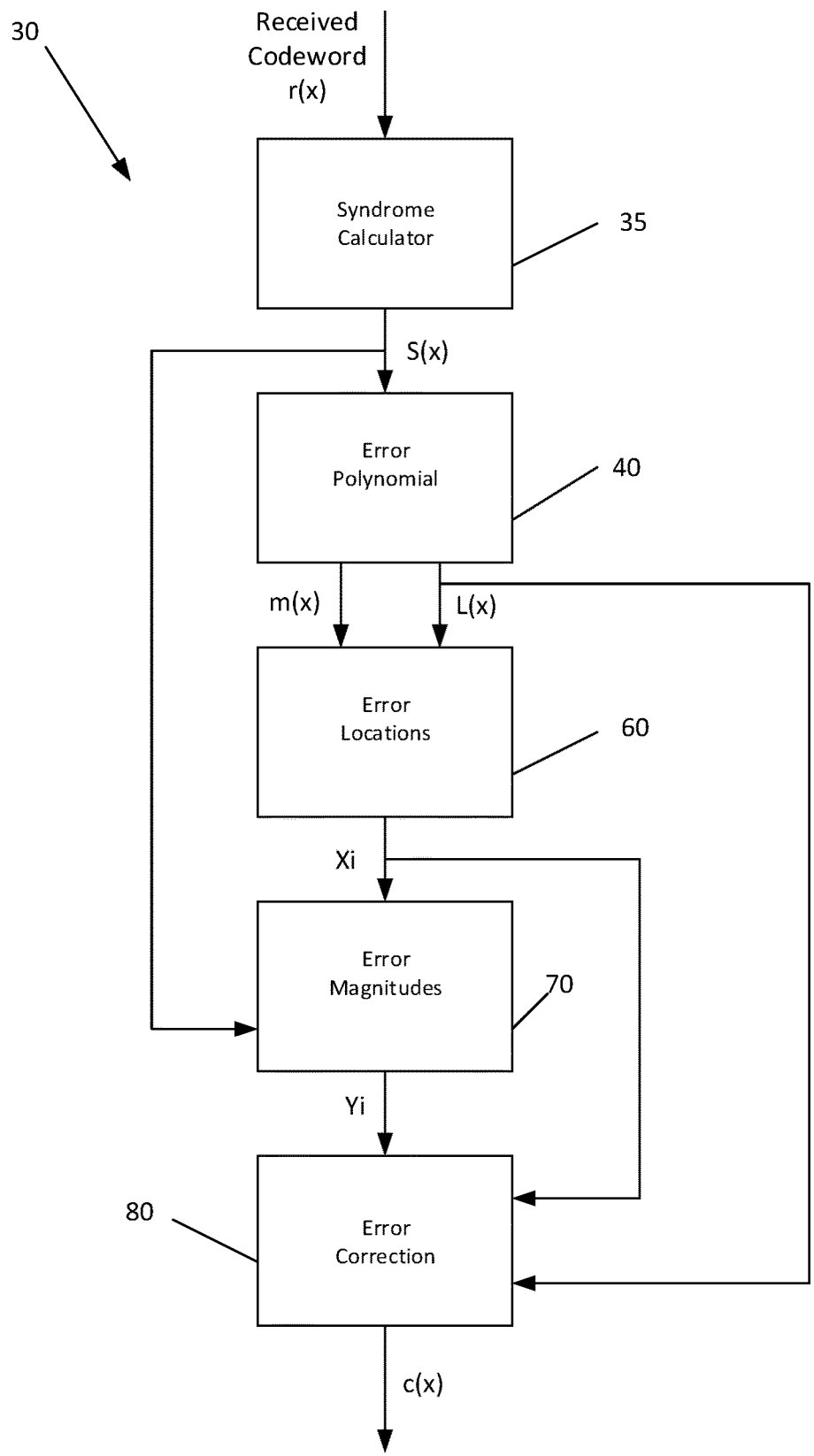
FIG. 3 illustrates a block diagram of an embodiment of a Reed-Solomon decoder.

Focusing on the RS decoder, a general architecture for decoding Reed-Solomon codes is shown in FIG. 3. The RS decoder in an embodiment resides in the memory controller, preferably close to memory. Solving or decoding the RS codeword is sequential in nature. The RS decoder 30 attempts to identify the position (location) and magnitude of up to "t" errors and to correct the random errors. The RS decoder 30 preferably is configured as a pipeline where continuous RS codewords are input. The RS decoder 30 includes a Syndrome calculator 35 which receives the codeword r(x). The received codeword r(x) is the original code word c(x) plus any errors e(x): r(x)=c(x)+e(x). If no errors have been introduced, e(x)=0, then r(x)=c(x). The Syndrome calculator 35 calculates the Syndromes S(x). The Syndrome block 35 computes as many independent syndrome words from the received codeword r(x) as there are parity symbols, which in the example of random error decoding is "2t".

The Syndromes S(x) are fed into the Error Polynomial block 40 to output the error locator polynomial L(x) and the error evaluation polynomial m(x). The Error Polynomial block 40 may also be referred to as the Key Equation Solver (KES) engine or block. In an embodiment, the Error Polynomial block 40 comprises the Berklekamp-Massey algorithm. The error locator polynomial L(x) is fed into the Error Locations block 60 to determine the error locations "Xi". In an embodiment, the Error Locations block 60 comprises the Chien search engine. The Chien search engine solves the locator polynomial L(x), e.g., finds zeros of the error-locator polynomial. The error locations "Xi" and the Syndromes "S(x)" are feed into Error Magnitudes block 70 to determine the error magnitudes "Yi". In the Error Magnitudes block 70 the error evaluator polynomial m(x) is solved. In an embodiment, the Forney algorithm is implemented to obtain the error magnitudes "Yi". All the blocks 35, 40, 60, and 70 can be arranged as four consecutive pipeline stages to work in parallel on consecutive codewords. Furthermore, Error Locations block 60 and Error Magnitudes block 70 can operate in parallel comprising a single pipeline stage. The error locator polynomial L(x), the error locations "Xi", and the error values or magnitudes "Yi", e.g., the error polynomial e(x), are fed into the Error Corrections block 80 to determine the original code word c(x). At Error correction block 80 the original codeword c(x) is reconstructed from the delayed decoder input r(x) and the computed error polynomial e(x).

RS decoders can also be configured to correct both random errors and erasures. For random errors and erasures, the codeword length (N) as shown in FIG. 2 is the dataword length "k" plus the parity length d (or codeword length or distance d), which for random errors and erasures the parity length d is 2t+f, where "t" is the number of random errors that can be corrected, and "f" is the number of erasures that can be corrected. In other words, the codeword length N=k+(2t+f) to correct for random errors and erasures. An errors and erasures (errata) RS decoder principally contains six (6) blocks: the syndrome calculator (SC) block; the erasure locator (EL) block to compute the erasure locator polynomial L(x)'; the Phi block to compute the Phi polynomial; the Key Equation Block (KES) to compute the errata polynomial L(x)" and the errata magnitude polynomial m(x)"; the Chien Search (CS) block; and the errata evaluator (EE) block to find the errata magnitudes (random error and erasure magnitudes).

Figure 4:
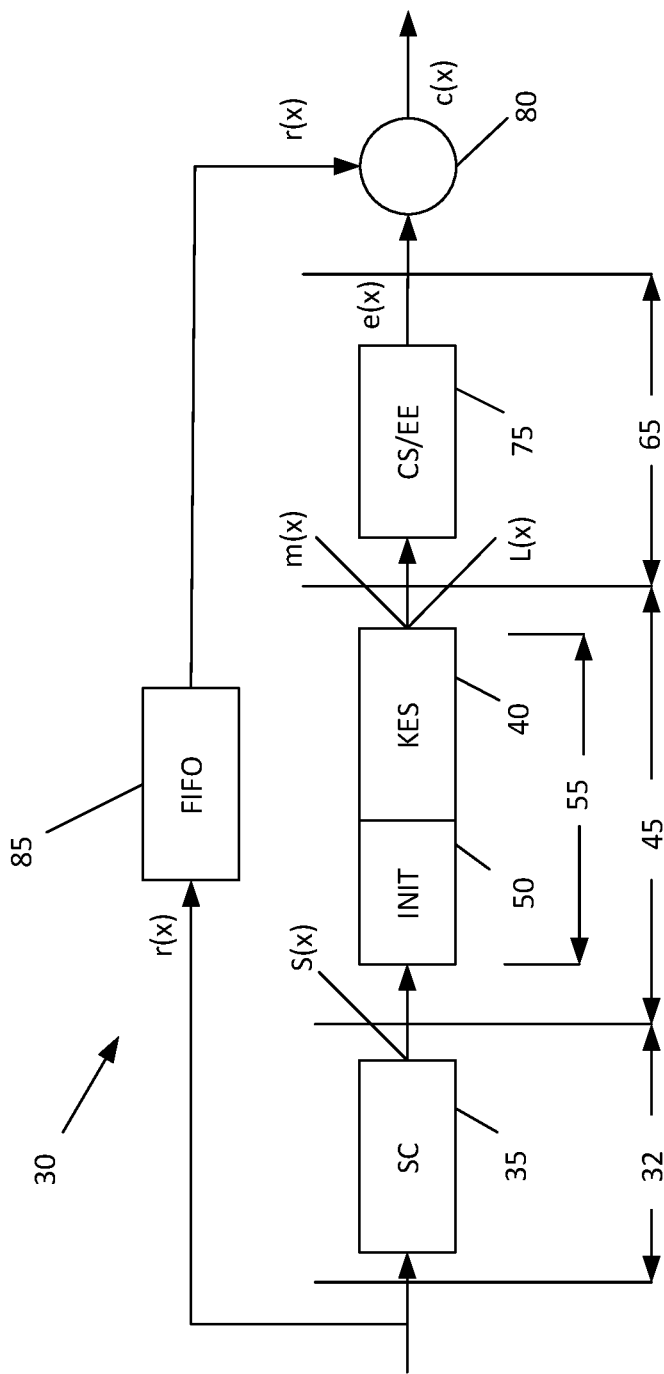
FIG. 4 illustrates a block diagram of an embodiment of a Reed-Solomon decoder.

In one or more embodiments an RS decoder 30 is configured and arranged as a three (3) stage pipeline as shown in FIG. 4. In the first stage of the RS decoder pipeline 30, the Syndromes S(x) are calculated from the decoder input r(x) using Syndrome Computation (SC) block 35. The SC block 35 in the first stage requires a whole codeword r(x) at input before it can produce the Syndrome S(x) output. With no parallelizing of the SC block 35, the SC block 35 would take N cycles (where N is the length of the codeword in symbols) to load the whole codeword r(x) and output the result. If syndrome computation operations in SC block 35 are parallelized, i.e., multiple symbols from input codeword are used in parallel in syndrome computation operations, the number of cycles (time) to produce the Syndrome S(x) output would be less. With a parallelism factor "P", the SC block takes N/P cycles to produce the output. The SC block 35 in an embodiment can be parallelized so that the Syndromes can be computed in a single cycle.

The second pipeline stage 45 of the RS decoder 35 combines the Key Equation Solver (KES) block 40 and an initialization (INIT) block 50. The initialization (INIT) block 50, which is used where the RS decoder can correct both random errors and/or erasures, is the combination of the erasure locator (EL) block and the Phi block. The erasure locator (EL) block computes the erasure locator polynomial L(x)'. The erasure locator (EL) block is trivial because it computes erasure locator polynomial for all possible erasure locations so the erasure locator polynomial coefficients are known in advance, so in the actual implementation the erasure locator polynomial L(x)' is just a list of constants so there is no polynomial computation. In this regard, the INIT block 50 represents in large part the Phi polynomial. The INIT block 50 combines 2t+f syndromes S(x) and up to "f" erasure locator coefficients into the Phi polynomial (that contains 2t+f Phi coefficients). The Phi polynomial is used by the KES block 40 to compute the errata locator polynomial L(x)" that contains both error locations and/or erasure locations. In the case of an RS decoder that is configured to correct errors and/or erasures, KES block 40 needs initialization values from the INIT block 50 that depend on the Syndromes S(x). The INIT block 50 requires up to "f" clock cycles to compute and output initialization values where "f" is the number of erasures that are corrected.

The KES block 40 in combination with the INIT block 50 solves the key equation to produce the errata locator polynomial L(x)" and the errata magnitude polynomial m(x)". The KES block 40 needs INIT block 50 for initialization values. The KES block 40 in an embodiment comprises the Berlekamp-Massey algorithm. In one or more embodiments, the RS decoder 30 uses the inverse free Berlekamp-Massey algorithm modified for errors and erasures as described in Zhang et al., *On the High Speed VLSI Implementation of Errors and Erasures Correcting Reed-Solomon Decoders*, GLSVLSI '02, Apr. 18-19, 2002, New York, N.Y., the entirety of which is incorporated by reference. The KES block 40 cannot be parallelized. Where the erasure locations are known, error and erasure (errata) locator polynomial L(x)" and the errata magnitude polynomial m(x)" can be calculated in a fixed time. The KES block 40 has a fixed pipeline depth of 2t, where "t" is the number of random errors that can be corrected. For example, if "t" is equal to 1, it will take 2 clock cycles of the KES block 40 to produce the errata locator polynomial L(x)" and the error magnitude polynomial m(x)". In other words, the KES block 40 needs two (2) iterations to produce its output. The KES block 40 is combined with the INIT block 50 in second stage pipeline 45 as Errata polynomial block 55. The Errata polynomial block 55 (i.e., the second stage 45) of the RS decoder 30 takes up to (2t+f) clock cycles $C_{55}$ to complete its computations.

The third pipeline stage 65 of the RS decoder 30 combines the Chien Search (CS) engine and the Errata Evaluation engine as CS/EE block 75. The Chien Search (SC) engine solves errata locator polynomial L(x)" to find the errata locations Xi" (errors and erasures). The Errata Evaluation (EE) engine solves the errata magnitude polynomial m(x)" to determine the errata (error and erasure) values Yi". In an example, the EE engine is the Forney algorithm. The Chien Search (CS) engine and the EE engine (e.g., the Forney algorithm) work in parallel and take the same number of cycles to perform the calculation and can even share some of the same resources. The difference between the CS/EE block 75 and the SC block 35 and the Errata polynomial block 55 is that the CS/EE block 75 has a logic depth of one, i.e., every clock cycle one beat of output data is produced. The CS/EE block 75 can be parallelized to decrease the latency (the number of clock cycles) to produce an output.

FIG. 4 also includes FIFO buffer 85, which receives the codeword r(x) that is input into the RS decoder 30 and delays delivery of the codeword r(x) to the error correction block 80. At error correction block 80 the original codeword c(x) is reconstructed from the delayed decoder input r(x) delivered from the FIFO buffer 85 and the error correction polynomial e(x) (e.g., the errata locations Xi" and errata magnitudes Yi") output from the RS decoder 30. The error correction polynomial e(x) is subtracted (in Galois field arithmetic) from the received code word r(x) to obtain the corrected codeword c(x) in error correction block 80.

In one or more embodiments, the throughput of an errata (random errors and erasures) Reed-Solomon (RS) decoder preferably is maximized while minimizing latency where resources are not wasted and the footprint (area on the chip) is minimized. Instead of using multiple RS decoders, the RS decoder is pipelined, preferably as a three stage pipeline, and some internal RS decoder engines or blocks are parallelized in order to reduce the number of clock cycles (the pipeline depth) to produce a result in a stage of the RS decoder). The errata Reed-Solomon (RS) decoder to correct random errors and/or erasures, in one or more embodiments, is arranged and configured into a three stage pipeline as shown in FIG. 4. The parallelization factor of the first stage comprising the SC block, and/or the parallelization factor of the third stage comprising the combined CS/EE block, in one or more embodiments, is adjusted so that the latency (number of cycles) to produce a result in each of those first and/or third stages (e.g., blocks) matches (or nearly matches) the latency (number of cycles) to produce a result in the second stage which comprises the Errata polynomial block.

More specifically, in a three stage pipeline RS decoder as shown in FIG. 4, in one or more embodiments, the parallelization factor of the syndrome computation (SC) block 35 is adjusted so that the latency (number of clock cycles) of the SC block 35 matches or nearly matches the latency (number of clock cycles) of the combined KES block 40 and the initialization (INIT) block 50 (the Errata polynomial block 55). Alternatively, and preferably additionally, in one or more embodiments, the parallelization factor of the Chien Search/Error Evaluation (CS/EE) block 75 is adjusted so that the latency (number of clock cycles) of the CS/EE block 75 matches or nearly matches the latency (number of clock cycles) of the combined KES block 40 and the initialization (INIT) block 50 (the Errata polynomial block 55). In a preferred embodiment, the number of clock cycles (e.g., pipeline depth) to complete each stage (the SC block 35, the Errata polynomial block 55, and the CS/EE block 75) of the RS decoder 30 is the same, or nearly the same, and in an embodiment the number of clock cycles to complete the first stage (SC block 35), and/or the number of clock cycles to complete the third stage (CS/EE block 75), is close to but is not smaller than the number of clock cycles to complete the second stage (Errata polynomial block 55).

The number of clock cycles for the SC block 35 to complete its computations depends upon the length "N" of the codeword. The SC block 35 requires "N" clock cycles to complete (where "N" is the codeword length). The SC block 35 can be parallelized so "P" computations can be performed in parallel per clock cycle. For example, if a single SC engine (P=1) in a RS decoder takes 10 cycles (N=10) to compute the Syndromes S(x) for a codeword r(x), and instead the RS decoder uses SC engine with parallelization factor "P"=5 in the SC block 35, the computation of the Syndromes S(x) can be computed in 2 cycles for that same codeword r(x) of length N=10. The latency ("$T_{35}$") of the SC block 35 to compute the Syndromes S(x), expressed as the number of clock cycles or stages "$CC_{35}$", is the total number "N" of cycles to compute the Syndromes S(x) for the codeword r(x) divided by the parallelization factor P, or ($CC_{35}$=N/P).

The initialization (INIT) block 50 takes "f" clock cycles to compute and output initialization values where "f" is the number of erasures that can be corrected. The INIT block 50 can also be parallelized. The INIT block 50 takes "f/PI" clock cycles to produce the output, where "PI" is the parallelization factor of the INIT block 50. In the case where the INIT block 50 is parallelized so that it takes one clock cycle for the INIT block 50 to complete, the parallelization factor PI=f.

The KES block 40, however, cannot be parallelized and requires a minimum of "2t" clock cycles to finish, where "t" is the maximum number of random errors that the RS decoder 30 can correct. For a RS decoder that handles erasures as well as random errors, e.g., an errata decoder, the KES block 40 requires initialization (INIT) block 50. The KES block 40 is combined with the INIT block 50 in second stage pipeline 45 as Errata polynomial block 55. The INIT block 50 requires up to "f" clock cycles to complete where "f" is the number of erasures that can be corrected. The number of cycles for the second stage of the pipeline 45 (i.e., the combined INIT block 50 and KES block 40 (Errata polynomial block 55)) to complete is the number of cycles for the KES block 40 to complete which is 2t, plus the number of cycles for the INIT block 50 to complete which is "f". Thus the total clock cycles $CC_{55}$ for the second stage 45, e.g., the errata polynomial 55, of the RS decoder 30 to complete is (2t+f).

It is advantageous to shorten the latency $T_{45}$ (number of clock cycles $CC_{45}$) for the second stage 45 errata polynomial block 55. Since the INIT block 50 can be parallelized, it is advantageous to parallelize the INIT block 50 to reduce the latency $T_{50}$ (the number of clock cycles $CC_{50}$) for the INIT block 50 to complete. In one or more embodiments it is advantageous to parallelize the INIT block 50 to complete in one cycle. In this manner, the parallelism factor "PI" of the INIT block 50 in an aspect equals "f", the number of erasures to correct. Since there are up to "f" erasures that can be corrected, the INIT block 50 in an aspect has a parallelization factor PI, where PI is the minimal number that satisfies f/PI≤1. In the case where the INIT block 50 is parallelized to complete in one cycle, the Errata polynomial block 55 completes in (2t+1) clock cycles $CC_{55}$. That is, the second stage 45 of the pipeline takes 2t+1 clock cycles to complete in the best case scenario ($CC_{55}=(2t+1)$).

To maintain a constant flow of input data r(x), the latency "$T_{35}$" of the SC block 35 to complete its computations should preferably be equal to, nearly equal to, and in an embodiment not be less than, the latency $T_{55}$ of the Errata polynomial block 55 (the combined INIT block 50 and KES block 40) to complete its computations. That is, the number of clock cycles $CC_{35}$ (pipeline depth) to complete the SC block 35 should be equal to or nearly equal to (but in an embodiment not be smaller than) the number of clock cycles $CC_{55}$ (pipeline depth) for the Errata polynomial block 55 to complete its computations for a well balanced system. Otherwise the SC block 35 will compute the Syndromes S(x) faster than the Errata polynomial block 55 can perform its computations, but will not provide any greater throughput. Over parallelizing the SC block 35 can be inefficient and a waste of resources if the Errata polynomial block 55 (the second stage of the pipeline) cannot complete its computations in the same amount (or nearly the same amount) of time, or number of clock cycles.

The best case latency $T_{55}$ of the Errata polynomial block 55 is the latency $T_{40}$ of the KES block 40 which is "2t", plus the best case latency $T_{50}$ of the initialization (INIT) block 50, which with maximum parallelization factor "PI", is performed in 1 cycle (f/PI=1). Accordingly, the best case latency $T_{55}$ of Errata polynomial block 55 is (2t+1). Since the number of clock cycles $CC_{55}$ (pipeline depth) of the SC block 35 in one or more embodiments preferably should be equal to, or nearly equal to, and more preferably is close to but not less than, the number of clock cycles CC55 (pipeline depth) of the Errata polynomial block 55, the parallelization factor P for the SC block 35 in one or more embodiments is the minimum number that satisfies the equation:

$CC_{35}=N/P \geq (2t+1)$ or $P=N/CC_{35} \leq N/(2t+1)$

The SC block 35 in one or more embodiments are parallelized to complete in $CC_{35}$ clock cycles where $CC_{35}$ is the nearest whole integer that is equal to or less than (2t+1).

Optimally, the latency $T_{75}$ of the CS/EE block 75 to complete its computations should also be adjusted so that it matches (or nearly matches) the latency $T_{55}$ for the Errata polynomial block 55 to complete its computations. That is the number of clock cycles $CC_{75}$ (e.g., the pipeline depth or the number of stages for that block/stage) of the CS/EE block 75 should match or nearly match, but preferably not be less than, the number of clock cycles $CC_{55}$ (pipeline depth) of the Errata polynomial block 55. CS/EE block 75 completing its computations in less number of clock cycles than $CC_{55}$ will not provide any greater throughput. Over parallelizing the CS/EE block 75 can be inefficient and a waste of resources if the Errata polynomial block 55 (the second stage of the pipeline) cannot complete its computations in the same amount (or nearly the same amount) of time, or number of clock cycles. However, over parallelizing the CS/EE block 75 can be used if total latency of RS decoder 30 needs to be further minimized. From above, the best case scenario for the latency $T_{55}$ or number of clock cycles $CC_{55}$ of the Errata polynomial block 55 is (2t+1). Accordingly, the number of clock cycles (or pipeline depth) $CC_{75}$ to complete the CS/EE block 75 should be the same as or nearly the same as, but preferably not less than 2t+1(e.g., $CC_{75} \geq (2t+1)$). The CS/EE block 75 should have a parallelization factor "PF" so that it completes in the same, or nearly the same, amount of time $T_{75}$ or clock cycles $CC_{75}$, but preferably not less than the amount of time $T_{55}$ or clock cycles $CC_{55}$ as the Errata polynomial block 55. Since the number of clock cycles $CC_{55}$ of the Errata polynomial block 55 is at best 2t+1 with the INIT block 50 parallelized so that it computes in one clock cycle ($CC_{50}=1$), the parallelism factor "PF" for the CS/EE block 75 in one or more embodiments is the minimum number that solves the equation:

$CC_{75}=N/PF \geq (2t+1)$ or $PF=N/CC_{75} \leq N/(2t+1)$

The combined CS/EE block 75 in one or more embodiments are parallelized to complete in $CC_{75}$ clock cycles where $CC_{75}$ is the nearest whole integer that is equal to or less than (2t+1).

Figure 5:
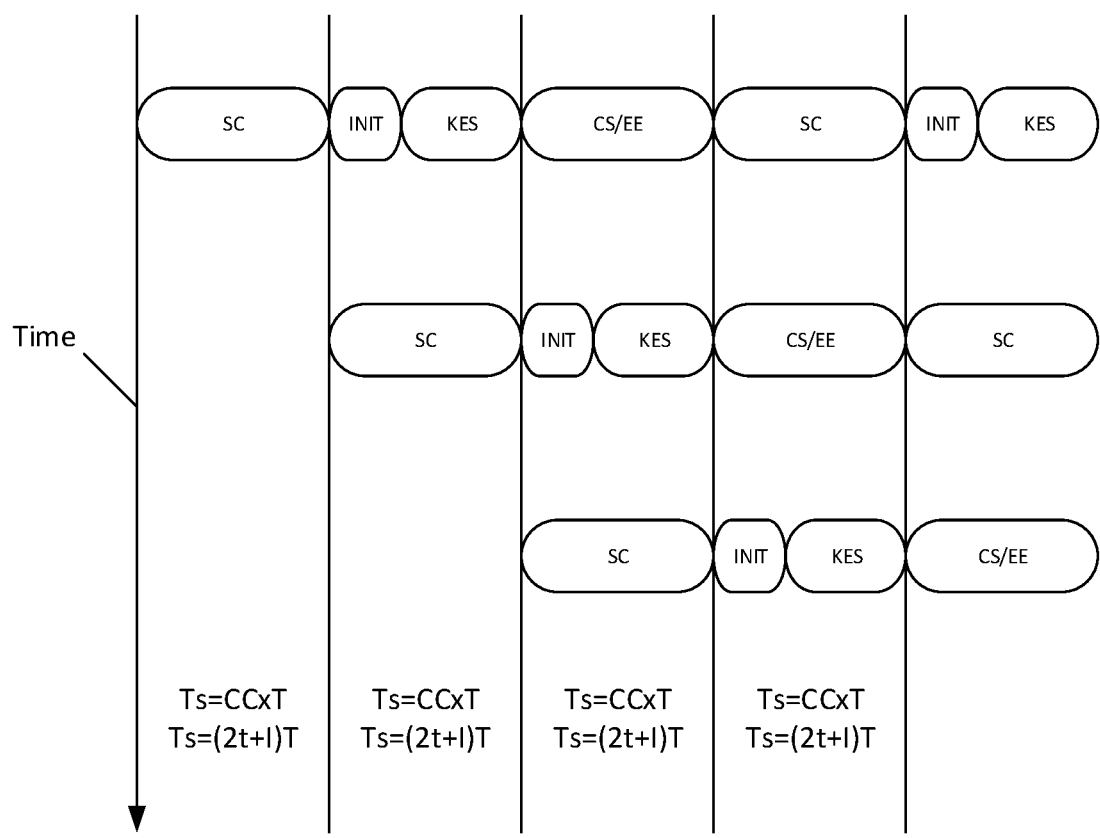
FIG. 5 illustrates the pipeline stages and timing of an embodiment of a Reed-Solomon decoder.

FIG. 5 illustrates the continuous operation of three-stage RS decoder 30 of FIG. 4, where after completing operations on one set of input data, each block immediately starts operations on the next set of input data. That is, continuous codewords are fed into the SC block 35 and each stage of the pipeline (SC block 35, Errata polynomial (INIT/KES) block 55, and the CS/EE block 75) complete their computations within the total time "Ts", where Ts=CC×T, where "T" is the length of the clock cycle and "CC" is the number of clock cycles (or stages) to complete the computations for the respective blocks. In an optimized RS decoder, throughput and total time "Trs" will be limited by the processing time in the Errata polynomial block 55, where the minimum time $T_{55}$ for the Errata polynomial block to complete is (2t+1). The maximum throughput "$TP_m$" for the RS decoder 30 in Bytes per second (Bytes/second) is the RS decoder payload size divided by the total time "$T_s$" for the slowest one of the RS decoder 30 stages to complete its operations. The "$TP_m$" for the RS decoder 30 is "k/(CC×T)" where k is the number of data symbols in a codeword (only data symbols are useful for calculating throughput and not parity symbols) and "CC" equals N/P, where P is the parallelism factor and where N/P equals (2t+1). That is $TP_m=k/(2t+1)$. The minimum latency for the three (3) stage pipeline RS decoder 30 is L=3 (number of stages) times "$T_s$" or 3×CC×T, where T is the length of the clock cycle (maximum pipeline stage latency for each of the stages/blocks) of RS decoder 30.

The architecture of the RS decoder 30 of FIG. 4 works irrespective of whether or not erasures are present, and requires minimal overhead to compute erasures as compared to the optimal overhead when erasures are not being processed. Throughput "TP" and latency $T_{rs}$ (the number of clock cycles $CC_{rs}$) of the errata RS decoder is the same whether the RS codeword contains or does not contain erasures and/or random errors. The architecture is also easily integrated in more complex interleaved ECC schemes (multi-tiered with Tier 1 and Tier 2 decoding) following the same principles to minimize latency and throughput in Tier 2 decoding while reusing most of the resources from Tier 1 decoding.

Figure 6:
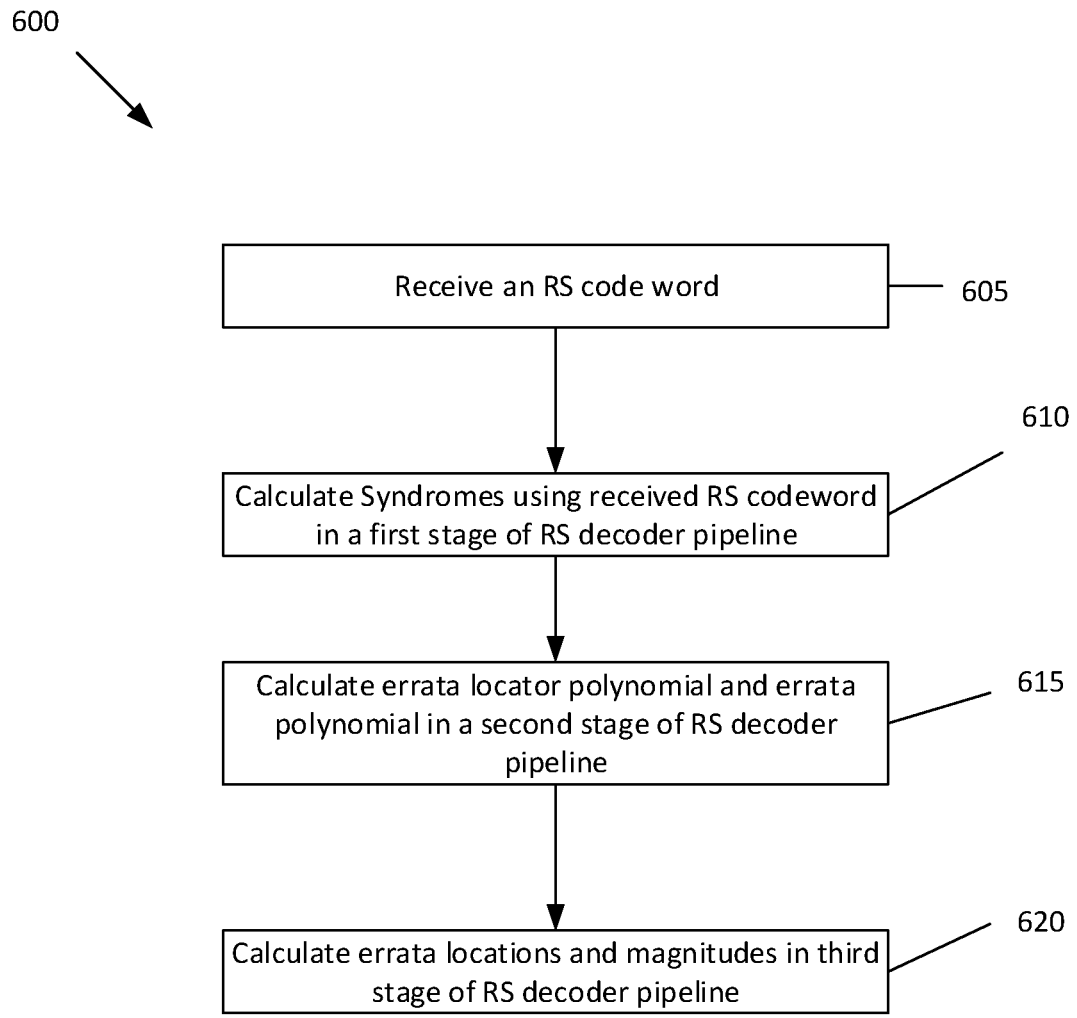
FIG. 6 is a flow chart of an embodiment of a method for decoding Reed-Solomon codewords.

FIG. 6 is an exemplary flowchart in accordance with one embodiment illustrating and describing a method of decoding Reed-Solomon (RS) codewords, including in an embodiment, processing and handling random errors and erasures in an RS decoder. The RS decoding method utilizes a RS decoder that in an aspect is arranged and configured as a three stage RS decoder. While the method 600 is described for the sake of convenience and not with an intent of limiting the disclosure as comprising a series and/or a number of steps, it is to be understood that the process does not need to be performed as a series of steps and/or the steps do not need to be performed in the order shown and described with respect to FIG. 6, but the process may be integrated and/or one or more steps may be performed together, simultaneously, or the steps may be performed in the order disclosed or in an alternate order.

The method 600 of decoding RS codewords to correct for random errors and/or erasures includes at 605 receiving a Reed Solomon (RS) codeword. The RS code word includes k data symbols that have been encoded with parity symbols, preferably "2t+f" parity symbols. Syndromes S(x) are calculated at 610 using the received RS codeword in a first stage of an RS decoder that preferably includes a Syndrome Computation (SC) engine. The SC engine in one or more embodiments is parallelized to complete its computations in 2t+1 clock cycles where t is the number of random errors that can be corrected in a codeword. An erasure locator polynomial L(x)" and an erasure magnitude polynomial m(x)" is computed at 615 in a second stage of the RS decoder pipeline. The errata locator polynomial L(x)" is preferably calculated from the Syndromes S(x) calculated at decoding process 610 preferably from the first stage of the RS decoder pipeline. The errata magnitude polynomial m(x)" is preferably calculated from the Syndromes S(x) calculated at the decoding process 610 preferably in the first stage of the RS decoder. The second stage of the RS decoder pipeline preferably includes a key equation solver (KES) engine and an initialization (INIT) unit.

At 620, the errata (both random error and/or erasure) locations and magnitudes are calculated. The errata locations and magnitudes are preferably calculated in a third stage of the RS decoder pipeline. The errata locations are computed from the errata locator polynomial L(x) and the syndromes S(x). The errata magnitudes are computed from the errata magnitude polynomial m(x). The third stage of the RS decoder pipeline in an embodiment includes a Chien Search (CS) engine to determine the errata locations and/or an errata evaluation (EE) engine. The third stage combines the CS engine and the EE engine and the two engines share resources in an embodiment. The errata evaluation engine (EE) in an embodiment comprises the Forney algorithm. The three stage RS decoder in an embodiment is configured to handle both random error correction and erasure correction. In one or more embodiments the combined CS engine and the EE engine in the third stage are each parallelized so that the third stage completes in close to but not less than or equal to 2t+1 clock cycles.

Figure 7:
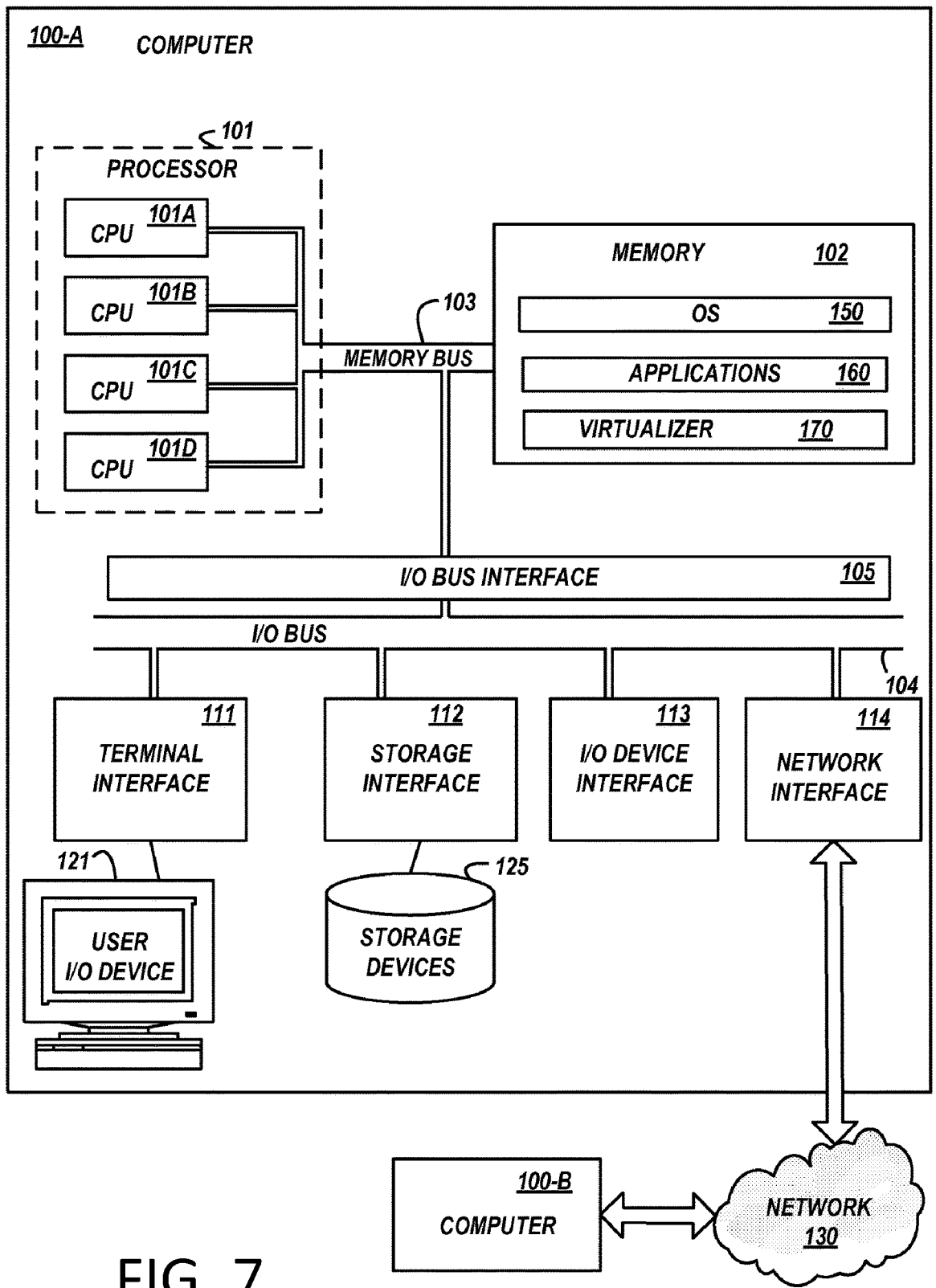
FIG. 7 is a functional block diagram illustrating a computer system, according to embodiments of the present disclosure.

FIG. 7 depicts a high-level block diagram representation of a computer 100-A connected to another computer 100-B via a network 130, according to an embodiment of the present invention. The term "computer" is used herein for convenience only, and in various embodiments is a more general data handling system, such as a mobile phone, tablet, server computer, etc. The mechanisms and apparatus of embodiments of the present invention apply equally to any appropriate data handling system.

The major components of the computer 100 may comprise one or more processors 101, a main memory system 102, a terminal interface 111, a storage interface 112, an Input/Output (I/O) device interface 113, and a network adapter or interface 114, all of which are communicatively coupled, directly or indirectly, for inter-component communication via a memory bus 103, an I/O bus 104, and an I/O bus interface unit 105. The computer 100 contains one or more general-purpose programmable central processing units (CPUs) 101A, 101B, 101C, and 101D, herein generically referred to as the processor 101. In an embodiment, the computer 100 contains multiple processors typical of a relatively large system; however, in another embodiment the computer 100 may alternatively be a single CPU system. Each processor 101 executes instructions stored in the main memory system 102 and may comprise one or more levels of on-board cache.

In an embodiment, the main memory system 102 may comprise a random-access semiconductor memory (e.g., a DRAM, an SCM, or both), storage device, or storage medium for storing or encoding data and programs. The main memory system 102 may include RS coding and the RS decoders disclosed and taught in the present disclosure. In another embodiment, the main memory system 102 represents the entire virtual memory of the computer 100, and may also include the virtual memory of other computer systems coupled to the computer 100 or connected via the network 130. The main memory system 102 is conceptually a single monolithic entity, but in other embodiments the main memory system 102 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The main memory system 102 stores or encodes an operating system (OS) 150, an application 160, and/or other program instructions. Although the operating system (OS) 150, application 160, etc. are illustrated as being contained within the main memory system 102 in the computer 100, in other embodiments some or all of them may be on different computer systems and may be accessed remotely, e.g., via the network 130. The computer 100 may use virtual addressing mechanisms that allow the programs of the computer 100 to behave as if they only have access to a large, single storage entity instead of access to multiple, smaller storage entities. Thus, while operating system 150, application 160, or other program instructions are illustrated as being contained within the main memory system 102, these elements are not necessarily all completely contained in the same storage device at the same time. Further, although operating system 150, application 160, other program instructions, etc. are illustrated as being separate entities, in other embodiments some of them, portions of some of them, or all of them may be packaged together.

In an embodiment, operating system 150, application 160, and/or other program instructions comprise instructions or statements that execute on the processor 101 or instructions or statements that are interpreted by instructions or statements that execute on the processor 101, to carry out the functions as further described below. When such program instructions are able to be run by the processor 101, such computer 100 becomes a particular machine configured to carry out such instructions. For example, instructions for a memory mirroring application 160A may be loaded upon one or more computers 100A that causes the computer 100A to mirror the main memory system 102 into a first portion and into a redundant second portion. In another example, main memory system 102 may be mirrored by operating system 150. In another example, main memory system 102 may be mirrored by a virtualizer application 170, such as a hypervisor.

One or more processors 101 may function as a general-purpose programmable graphics processor unit (GPU) that builds images (e.g. a GUI) for output to a display. The GPU, working in conjunction with one or more applications 160, determines how to manipulate pixels on, for example, a display, touch screen, etc. to create a display image or user interface. Ultimately, the image (e.g. GUI, etc.) is displayed to a user. The processor 101 and GPU may be discrete components or may be integrated into a single component.

The memory bus 103 provides a data communication path for transferring data among the processor 101, the main memory system 102, and the I/O bus interface unit 105. The I/O bus interface unit 105 is further coupled to the system I/O bus 104 for transferring data to and from the various I/O units. The I/O bus interface unit 105 communicates with multiple I/O interface units 111, 112, 113, and 114, which are also known as I/O processors (IOPs) or I/O adapters (IOAs), through the system I/O bus 104. The I/O interface units support communication with a variety of storage and I/O devices. For example, the terminal interface unit 111 supports the attachment of one or more user I/O devices 121, which may comprise user output devices (such as a video display device, speaker, and/or television set) and user input devices (such as a keyboard, mouse, keypad, touchpad, trackball, buttons, light pen, or other pointing device). A user may manipulate the user input devices using a user interface, in order to provide input data and commands to the user I/O device 121 and the computer 100, and may receive output data via the user output devices. For example, a user interface may be presented via the user I/O device 121, such as displayed on a display device, played via a speaker, or printed via a printer. The user interface may be a user interface that provides content to a user visually (e.g. via a screen), audibly (e.g. via a speaker), and/or via touch (e.g. vibrations, etc.). In some embodiments, the computer 100 itself acts as the user interface as the user may move the computer 100 in ways to interact with, input, or manipulate computer application 160 data, function, etc.

The storage interface unit 112 supports the attachment of one or more local disk drives or secondary storage devices 125. In an embodiment, the secondary storage devices 125 are rotating magnetic disk drive storage devices, but in other embodiments they are arrays of disk drives configured to appear as a single large storage device to a host computer, or any other type of storage device. The contents of the main memory system 102, or any portion thereof, may be stored to and retrieved from the secondary storage devices 125, as needed. The local secondary storage devices 125 typically have a slower access time than does the main memory system 102, meaning that the time needed to read and/or write data from/to the main memory system 102 is less than the time needed to read and/or write data from/to for the local secondary storage devices 125.

The I/O device interface 113 provides an interface to any of various other input/output devices or devices of other types, such as printers or fax machines. The network adapter 114 provides one or more communications paths from the computer 100 to other data handling devices such as numerous other computers; such paths may comprise, e.g., one or more networks 130. Although the memory bus 103 is shown in FIG. 7 as a relatively simple, single bus structure providing a direct communication path among the processors 101, the main memory system 102, and the I/O bus interface 105, in fact the memory bus 103 may comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 105 and the I/O bus 104 are shown as single respective units, the computer 100 may, in fact, contain multiple I/O bus interface units 105 and/or multiple I/O buses 104. While multiple I/O interface units are shown, which separate the system I/O bus 104 from various communications paths running to the various I/O devices, in other embodiments some or all of the I/O devices are connected directly to one or more system I/O buses.

I/O interface 113 may contain electronic components and logic to adapt or convert data of one protocol on I/O bus 104 to another protocol on another bus. Therefore, I/O interface 113 may connect a wide variety of devices to computer 100 and to each other such as, but not limited to, tape drives, optical drives, printers, disk controllers, other bus adapters, PCI adapters, workstations using one or more protocols including, but not limited to, Token Ring, Gigabyte Ethernet, Ethernet, Fibre Channel, SSA, Fiber Channel Arbitrated Loop (FCAL), Serial SCSI, Ultra3 SCSI, Infiniband, FDDI, ATM, 1394, ESCON, wireless relays, Twinax, LAN connections, WAN connections, high performance graphics, etc. Though shown as distinct entities, the multiple I/O interface units 111, 112, 113, and 114 or the functionality of the I/O interface units 111, 112, 113, and 114 may be integrated into a similar device.

In various embodiments, the computer 100 is a multi-user mainframe computer system, a single-user system, a server computer, storage system, or similar device that has little or no direct user interface, but receives requests from other computer systems (clients). In other embodiments, the computer 100 is implemented as a desktop computer, portable computer, laptop or notebook computer, tablet computer, pocket computer, telephone, smart phone, pager, automobile, teleconferencing system, appliance, or any other appropriate type of electronic device.

The network 130 may be any suitable network or combination of networks and may support any appropriate protocol suitable for communication of data and/or code to/from the computer 100A and at least the computer 100B. In various embodiments, the network 130 may represent a data handling device or a combination of data handling devices, either connected directly or indirectly to the computer 100. In another embodiment, the network 130 may support wireless communications. Alternatively and/or additionally, the network 130 may support hard-wired communications, such as a telephone line or cable. In an embodiment, the network 130 may be the Internet and may support IP (Internet Protocol). In an embodiment, the network 130 is implemented as a local area network (LAN) or a wide area network (WAN). In an embodiment, the network 130 is implemented as a hotspot service provider network. In another embodiment, the network 130 is implemented on an intranet. In an embodiment, the network 130 is implemented as any appropriate cellular data network, cell-based radio network technology, or wireless network. In an embodiment, the network 130 is implemented as any suitable network or combination of networks. Although one network 130 is shown, in other embodiments any number of networks (of the same or different types) may be present.

FIG. 7 is intended to depict the representative major components of the computer 100. But, individual components may have greater complexity than represented in FIG. 7, components other than or in addition to those shown in FIG. 7 may be present, and the number, type, and configuration of such components may vary. Several particular examples of such additional complexity or additional variations are disclosed herein; these are by way of example only and are not necessarily the only such variations. The various program instructions implementing, for example, upon computer system 100 according to various embodiments of the invention may be implemented in a number of manners, including using various computer applications, routines, components, programs, objects, modules, data structures, etc.

Figure 8:
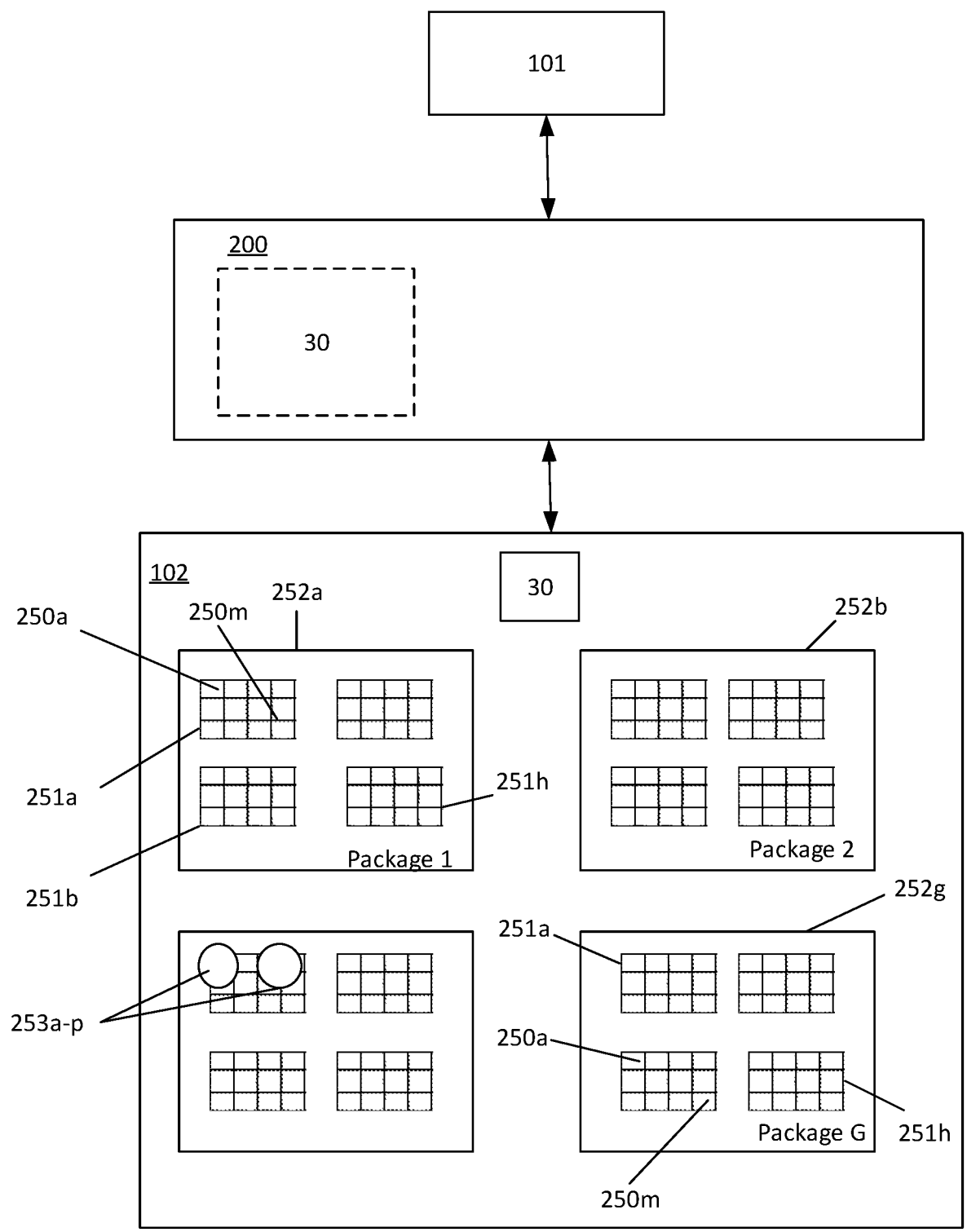
FIG. 8 is a functional block diagram illustrating an example memory system and controller, according to embodiments of the present disclosure.

Referring now to FIG. 8, a schematic block diagram of an example main memory system 102 in communication with the processor 101 via a memory controller 200 is illustrated. In one or more embodiments the RS coding is employed and an RS decoder 30 is included on the memory card 102. In an alternative embodiment, the RS decoder 30 is included on memory controller 200, and in yet a further embodiment, the RS decoder is included on the memory controller and the memory controller is included on the memory card 102. As shown in FIG. 8, memory module(s) or card(s) 102 (e.g., an SCM media card) is configured to store data in a plurality "G" of packages, (i.e., chips) 252a-g (e.g., G=24), and each package includes a plurality "H" dies 251a-h (e.g., H=16). Each package in an embodiment can include the same number "H" of dies (e.g., H=8, 16, etc.). Each of dies 251a-h includes a number "M" of memory cells, in particular memory cells 250a-m. Each memory module/card 102 (e.g., SCM media card) has I/O data with z-bit data width, and appropriate-sized address bits depending on the capacity. SCM may be, for example, Phase Change Memory (PCM), Resistive RAM (RRAM), 3D XPoint, ReRam, STT-MRAM, or any suitable non-volatile storage.

While FIG. 8 illustrates the memory controller 200 as being located outside the memory module/card 102, the disclosure is not so limiting, and the controller 200 may be a part of the memory module/card 102. In other examples, controller 200 may include additional modules or hardware units, or may include fewer modules or hardware units. Memory controller 200 may include a microprocessor, digital signal processor (DSP), application specific integrated circuit (ASIC), field programmable gate array (FPGA), or other digital logic circuitry.

Typically, SCM is implemented as groups of solid state devices connected to a computing system via several input/output (I/O) adapters, which are used to map technology of an I/O device to the memory bus of the central processing unit(s). An SCM media card is typically organized as a collection of packages that each include "N" number of dies with millions of memory elements that are byte-addressable. One characteristic of SCMs is that these memory devices have finite write endurance. A memory device with finite write endurance means that it cannot be written indefinitely before parts of the SCM start faulting. To achieve high capacity and fast data access, SCM technology based devices contain multiple chips/packages, which are accessed in parallel by the controller. Error Correction Code (ECC) and Redundant Array of Independent Disks (RAID) schemes are used to achieve high reliability and robustness against chip/package failures.

While the illustrative embodiments described above are preferably implemented in hardware, such as in units and circuitry of a processor, various aspects of the illustrative embodiments and/or techniques may be implemented in software as well. For example, it will be understood that each block of the flowchart illustration in FIG. 6, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions, and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

One or more embodiments of the present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

The corresponding structures, materials, acts, and equivalents of all means or step plus function elements in the claims below are intended to include any structure, material, or act for performing the function in combination with other claimed elements as specifically claimed. The description of the embodiments of the present disclosure has been presented for purposes of illustration and description, but is not intended to be exhaustive or limited to the embodiments in the form disclosed. Many modifications and variations will be apparent to those of ordinary skill in the art without departing from the scope and spirit of the disclosure. The embodiments and examples were chosen and described in order to best explain the principles of the disclosure and the practical application, and to enable others of ordinary skill in the art to understand the disclosure for various embodiments with various modifications as are suited to the particular use contemplated.

The programs described herein are identified based upon the application for which they are implemented in a specific embodiment of the disclosure. However, it should be appreciated that any particular program nomenclature herein is used merely for convenience, and thus the disclosure should not be limited to use solely in any specific application identified and/or implied by such nomenclature.

It will be clear that the various features of the foregoing systems and/or methodologies may be combined in any way, creating a plurality of combinations from the descriptions presented above.

It will be further appreciated that embodiments of the present disclosure may be provided in the form of a service deployed on behalf of a customer to offer service on demand.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A Reed-Solomon decoder for decoding Reed-Solomon codewords, the Reed-Solomon decoder comprising:
    one or more Syndrome Computation engines for receiving the Reed-Solomon ("RS") codeword and computing one or more Syndromes;
    a key equation solver engine for generating an errata locator polynomial and an errata magnitude polynomial;
    one or more initialization units for providing initialization values for the key equation solver engine;
    one or more Chien Search engines for receiving the error locator polynomial and determining the one or more locations of the one or more erasures and random errors in the received Reed-Solomon codeword; and
    one or more error-value evaluation ("EE") engines for receiving the errata magnitude polynomial and determining the one or more magnitudes of the one or more erasures and random errors in the RS received codeword,
    wherein the Reed-Solomon decoder is configured as a three stage pipeline wherein the one or more Syndrome Computation engines are configured in a first stage, the key equation solver engine and the one or more initialization units are configured as a second stage, and the one or more Chien Search engines and the one or more EE engines are configured as a third stage.

2. The Reed-Solomon decoder of claim 1, wherein the one or more initialization units are parallelized.

3. The Reed-Solomon decoder of claim 2, wherein the one or more initialization units are parallelized to calculate the initialization values in a single clock cycle.

4. The Reed-Solomon decoder of claim 2, wherein the one or more Syndrome Computation engines are parallelized.

5. The Reed-Solomon decoder of claim 3, wherein the one or more Syndrome Computation engines are parallelized so that the parallelized group of the one or more Syndrome Computation engines computes the one or more Syndromes for the received RS codeword in 2t+1 clock cycles, where t is the number of random errors that are correctable in the received RS codeword.

6. The Reed-Solomon decoder of claim 1, wherein the one or more Chien Search engines are parallelized.

7. The Reed-Solomon decoder of claim 3, wherein the one or more Chien Search engines are parallelized so that the parallelized group of the one or more Chien Search engines solves the errata locator polynomial in 2t+1 clock cycles, where t is the number of random errors that are correctable in the received RS codeword.

8. The Reed-Solomon decoder of claim 1, wherein the one or more EE engines are parallelized.

9. The Reed-Solomon decoder of claim 7, wherein the one or more EE engines are parallelized so that the parallelized group of one or more EE Search engines solves the errata magnitude polynomial in 2t+1 clock cycles, where t is the number of random errors that are correctable in the received RS codeword.

10. The Reed-Solomon decoder of claim 3, wherein the one or more Chien Search engines and the one or more EE engines are combined in one or more CS/EE units where each combined CS/EE unit shares resources, and the one or more combined SC/EE units are parallelized to solve the errata locator polynomial and the errata magnitude polynomial in 2t+1 clock cycles, where t is the number of random errors that are correctable in the received RS codeword.

11. The Reed-Solomon decoder of claim 5, wherein the one or more Chien Search engines and the one or more EE engines are combined in one or more CS/EE units where each combined CS/EE unit shares resources, and the one or more combined SC/EE units are parallelized to solve the errata locator polynomial and the errata magnitude polynomial in 2t+1 clock cycles, where t is the number of random errors that are correctable in the received RS codeword.

12. The Reed-Solomon decoder of claim 1, wherein the Reed-Solomon decoder is on a module containing the memory devices.

13. A memory system comprising:
    A memory module comprising a plurality of memory devices, a Reed-Solomon encoder and a Reed Solomon decoder, the Reed Solomon (RS) decoder configured as a three stage pipeline comprising:
    one or more Syndrome Computation engines arranged and configured in a first stage of the RS decoder pipeline for receiving the Reed-Solomon ("RS") codeword and computing the Syndromes;
    a key equation solver (KES) engine for generating an errata locator polynomial and an errata magnitude polynomial;
    one or more initialization (INIT) units for providing initialization values for the KES engine; wherein the KES engine and one or more INIT units are configured in a second stage of the RS decoder pipeline;
    one or more Chien Search (CS) engines for receiving the errata locator polynomial and determining the location of one or more erasures and random errors in the received RS codeword; and
    one or more error-value evaluation ("EE") engines for calculating the magnitude of the erasures and random errors in the received RS codeword, the one or more CS engines and the one or more EE engines are combined in one or more combined CS/EE units where each combined CS/EE unit shares resources, wherein the one or more combined CS/EE units are configured in a third stage of the RS decoder pipeline.

14. The memory system of claim 13, wherein the one or more INIT units are parallelized to complete in one cycle.

15. The memory system of claim 13, wherein the second stage of the RS decoder is configured to compute the errata locator polynomial and the errata magnitude polynomial in 2t+1 clock cycles, where t is the number of random errors that are correctable in the RS codeword.

16. The memory system of claim 13, wherein,
    the one or more SC engines are parallelized to complete in $CC_{SC}$ clock cycles where $CC_{SC}$ is the nearest whole integer that is equal to or not less than 2t+1; and
    the one or more CS/EE units are parallelized to complete in $CC_{CS/EE}$ clock cycles, where $CC_{SC}$ is the nearest whole integer that is equal to or not less than 2t+1.

17. A method for decoding Reed-Solomon codes for errata including at least one of the group consisting of random errors, erasures, and combinations thereof, the method comprising:
- receiving a RS codeword in a first stage of an RS decoder;
- in response to receiving the RS codeword, computing one or more Syndromes in the first stage of the RS decoder;
- receiving the one or more Syndromes in a second stage of the RS decoder;
- in response to receiving the one or more Syndromes, computing an errata locator polynomial and an errata magnitude polynomial in the second stage of the RS decoder;
- receiving the errata locator polynomial and the errata magnitude polynomial in a third stage of the RS decoder: and
- in response to receiving the errata locator polynomial and the errata magnitude polynomial, computing the errata locations and errata magnitudes.

18. The method of claim 17, further comprising subtracting the errata locations and errata magnitudes from the RS codeword.

19. The method of claim 17, wherein the second stage comprises a key equation solver (KES) engine and an initialization (INIT) unit that is combined into a INIT/KES block that computes the errata locator polynomial and the errata magnitude polynomial, wherein the INIT unit is parallelized so that the INIT/KES block computes the errata locator polynomial and the errata magnitude polynomial in 2t+1 clock cycles where t is the number of random errors that are correctable in the RS codeword.

20. The method of claim 19, wherein the first stage comprises one or more Syndrome Computation (SC) engines to compute the Syndromes, the third stage comprises one or more Chien Search (CS) engines to solve the errata locator polynomial and one or more Error Evaluator (EE) engines to solve the errata magnitude polynomial and the one or more CS engines and EE engines are combined into one or more CS/EE blocks; and wherein,
- the one or more SC engines are parallelized to complete in $CC_{SC}$ clock cycles where $CC_{SC}$ is the nearest whole integer that is equal to or not less than 2t+1; and
- the one or more CS/EE blocks are parallelized to complete in $CC_{CS/EE}$ clock cycles, where $CC_{SC}$ is the nearest whole integer that is equal to or not less than 2t+1.

* * * * *